US006849500B2

(12) United States Patent
Kato et al.

(10) Patent No.: US 6,849,500 B2
(45) Date of Patent: Feb. 1, 2005

(54) METHOD FOR MANUFACTURING A NONVOLATILE MEMORY DEVICE INCLUDING AN OPENING FORMED INTO AN INVERSE-TAPERED SHAPE

(75) Inventors: Aiko Kato, Suwa (JP); Takumi Shibata, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/377,016

(22) Filed: Feb. 28, 2003

(65) Prior Publication Data

US 2003/0219944 A1 Nov. 27, 2003

(30) Foreign Application Priority Data

Mar. 1, 2002 (JP) ........................................ 2002-055982

(51) Int. Cl.[7] ............................................ H01L 21/336
(52) U.S. Cl. ........................ 438/257; 438/266; 438/267
(58) Field of Search .................................. 438/257–267

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,969,383 A | 10/1999 | Chang et al. | |
| 6,177,318 B1 | 1/2001 | Ogura et al. | |
| 6,191,441 B1 * | 2/2001 | Aoki et al. | 257/295 |

(List continued on next page.)

FOREIGN PATENT DOCUMENTS

| | | |
|---|---|---|
| JP | 01-239956 | 9/1989 |
| JP | 7-161851 | 6/1995 |
| JP | 2978477 | 9/1999 |
| JP | 2001-007046 | 1/2001 |
| JP | 2001-148434 | 5/2001 |
| JP | 2001-156188 | 6/2001 |

OTHER PUBLICATIONS

Chen, et al., "A Novel Flash Memory Device with S Plit Gate Source Side Injection and ONO Charge Storage Stack (SPIN)," 1997 Symposium on VLSI Technology Digest of Technical Papers, pp. 63–64.

Chang, et al., "A New SONOS Memory Using Source–Side Injection for Programming," IEEE Electron Device Letters, vol. 19, No. 7, Jul. 1998, pp. 253–255.

Hayashi, et al., "Twin MONOS Cell with Dual Control Gates," 2000 Symposium on VLSI Technology Digest of Technical Papers (2 pages).

Communication from Japanese Patent Office re: counterpart application.

*Primary Examiner*—Jack Chen
(74) *Attorney, Agent, or Firm*—Harness, Dickey & Pierce, P.L.C.

(57) ABSTRACT

A method, for manufacturing a nonvolatile memory device, includes: forming a first insulating layer above a semiconductor layer; forming a first conductive layer above the first insulating layer: forming a stopper layer above the first conductive layer; patterning the stopper layer and the first conductive layer; forming an ONO film made of a first silicon oxide layer, a silicon nitride layer and a second silicon oxide layer above the semiconductor layer and on both side surfaces of the first conductive layer; forming a second conductive layer above the ONO film; applying anisotropic etching to the second conductive layer, and thereby forming a side wall-like control gate aside each of both side surfaces of the first conductive layer, the ONO film being interposed therebetween; forming an impurity layer to be a source region or a drain region inside of the semiconductor layer; forming a second insulating layer over an entire surface; polishing the second insulating layer so as to expose the stopper layer; removing the stopper layer; forming, on the entire surface, a third conductive layer made of a laminate film of a titanium layer and a titanium nitride layer; patterning the third conductive layer and thereby forming a word line; and patterning the first conductive layer and thereby forming a word gate.

1 Claim, 10 Drawing Sheets

U.S. PATENT DOCUMENTS

| | | |
|---|---|---|
| 6,248,633 B1 | 6/2001 | Ogura et al. |
| 6,255,166 B1 | 7/2001 | Ogura et al. |
| 6,413,821 B1 * | 7/2002 | Ebina et al. ................. 438/257 |
| 6,518,124 B1 | 2/2003 | Ebina et al. |
| 6,627,491 B2 * | 9/2003 | Ebina et al. ................. 438/216 |
| 2002/0100929 A1 | 8/2002 | Ebina et al. |
| 2002/0127805 A1 | 9/2002 | Ebina et al. |
| 2003/0054610 A1 | 3/2003 | Ebina et al. |
| 2003/0057505 A1 * | 3/2003 | Ebina et al. ................. 257/411 |
| 2003/0058705 A1 | 3/2003 | Ebina et al. |
| 2003/0060011 A1 * | 3/2003 | Ebina et al. ................. 438/257 |

* cited by examiner

METHOD FOR MANUFACTURING A NONVOLATILE MEMORY DEVICE INCLUDING AN OPENING FORMED INTO AN INVERSE-TAPERED SHAPE

TECHNICAL FIELD

The present invention relates to a method for manufacturing a nonvolatile memory device, in particular, to a method for manufacturing a nonvolatile memory device including a plurality of charge storage regions for one word gate.

BACKGROUND

As one type of nonvolatile memory devices, there is a type called a MONOS (Metal Oxide Nitride Oxide Semiconductor) type or SONOS (Silicon Oxide Nitride Oxide Silicon) type in which a gate insulating layer between a channel region and a control gate is made of a laminated body of a silicon oxide layer/a silicon nitride layer/a silicon oxide layer and the silicon nitride layer traps electric charges.

The device shown in FIG. 16 is representative of the well-known types of MONOS type nonvolatile semiconductor memory device.(Y. Hayashi, et al, 2000 Symposium on VLSI Technology Digest of Technical Papers, p.122–p.123).

In a memory cell 100 of the MONOS type, a word gate 14 is formed on a semiconductor substrate 10 with a first gate insulating layer 12 interposed therebetween. On both sides of the word gate 14, a side wall-like first control gate 20 and a second control gate 30 are disposed, respectively. Between the bottom portion of the first control gate 20 and the semiconductor substrate 10, a second gate insulating layer 22 is existed, and between the side surface of the first control gate 20 and the word gate 14, there is an insulating layer 24. Similarly, between the bottom portion of the second control gate 30 and the semiconductor substrate 10, there is a second gate insulating layer 22, and between the side surface of the second control gate 30 and the word gate 14, there is the insulating layer 24. In addition, between the control gate 20 and the control gate 30, of adjacent memory cells (no interposed word gate 14), in the semiconductor substrate 10, an impurity layer 16 or 18 that constitutes a source region or a drain region is formed.

Thus, one memory cell 100 includes two MONOS type memory elements on the side surfaces of the word gate 14. Furthermore, these two MONOS type memory elements can be independently controlled. Accordingly, one memory cell 100 can memorize 2-bit information.

SUMMARY

Embodiments of the present invention provide: methods for manufacturing a MONOS-type nonvolatile memory device including a plurality of charge storage regions; and the resulting memory devices.

A method, for manufacturing a nonvolatile memory device according to an embodiment of the present invention, includes: forming a first insulating layer above a semiconductor layer; forming a first conductive layer above the first insulating layer; forming a stopper layer above the first conductive layer; patterning the stopper layer and the first conductive layer; forming an ONO film made of a first silicon oxide layer, a silicon nitride layer and a second silicon oxide layer above the semiconductor layer and on both side surfaces of the first conductive layer; forming a second conductive layer above the ONO film; applying anisotropic etching to the second conductive layer, and thereby forming a side wall-like control gate aside each of both side surfaces of the first conductive layer, the ONO film being interposed therebetween; forming an impurity layer to be a source region or a drain region inside of the semiconductor layer; forming a second insulating layer over an entire surface; polishing the second insulating layer so as to expose the stopper layer; removing the stopper layer; forming, on the entire surface, a third conductive layer made of a laminate film of a titanium layer and a titanium nitride layer; patterning the third conductive layer and thereby forming a word line; and patterning the first conductive layer and thereby forming a word gate.

A method, for manufacturing a nonvolatile memory device according to another embodiment of the present invention, includes: forming a first insulating layer above a semiconductor layer; forming a first conductive layer above the first insulating layer; forming a stopper layer above the first conductive layer; patterning the stopper layer and the first conductive layer; forming an ONO film made of a first silicon oxide layer, a silicon nitride layer and a second silicon oxide layer above the semiconductor layer and on both side surfaces of the first conductive layer; forming a second conductive layer above the ONO film; applying anisotropic etching to the second conductive layer, and thereby forming a side wall-like control gate aside each of both side surfaces of the first conductive layer with the ONO film interposed therebetween; forming an impurity layer to be a source region or a drain region inside of the semiconductor layer; forming a second insulating layer over an entire surface; polishing the second insulating layer so as to expose the stopper layer; removing the stopper layer; forming, on the entire surface, a third conductive layer made of a laminate film made of a polycrystalline silicon layer and a metal silicide layer; patterning the third conductive layer, and thereby forming a word line; and patterning the first conductive layer, and thereby forming a word gate.

A method, for manufacturing a nonvolatile memory device according to another embodiment of the present invention, includes: forming a first insulating layer above a semiconductor layer; forming a first conductive layer above the first insulating layer; forming a stopper layer above the first conductive layer; patterning the stopper layer and the first conductive layer; forming an ONO film made of a first silicon oxide layer, a silicon nitride layer and a second silicon oxide layer above the semiconductor layer and on both side surfaces of the first conductive layer; forming a second conductive layer above the ONO film; applying anisotropic etching to the second conductive layer, and thereby forming a side wall-like control gate aside each of both side surfaces of the first conductive layer with the ONO film interposed therebetween; forming an impurity layer to be a source region or a drain region inside of the semiconductor layer; forming a second insulating layer over an entire surface; polishing the second insulating layer so as to expose the stopper layer; removing the stopper layer; forming, on the entire surface, a third conductive layer made of a laminate film made of a polycrystalline silicon layer, a titanium layer, and a titanium nitride layer; patterning the third conductive layer, and thereby forming a word line; and patterning the first conductive layer, and thereby forming a word gate.

Additional features and advantages of the invention will be more fully apparent from the following detailed description of example embodiments, the appended claims and the accompanying drawings.

The accompanying drawings are: intended to depict example embodiments of the invention and should not be interpreted to limit the scope thereof; and not to be considered as drawn to scale unless explicitly noted.

DETAILED DESCRIPTION

Nonvolatile Memory Device Structure

Figure 1:
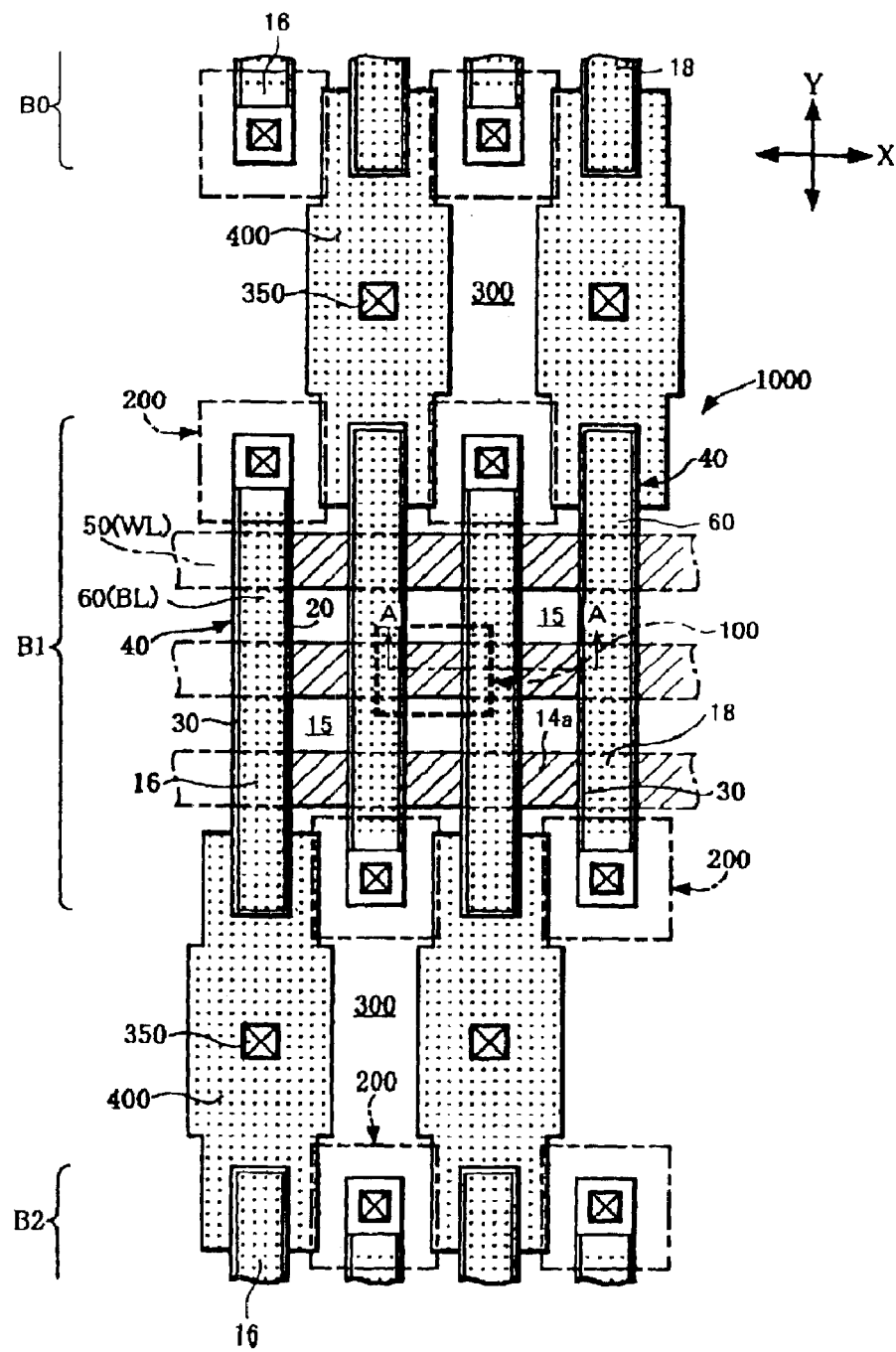
FIG. 1 is a plan view schematically showing a layout of a semiconductor device according to an embodiment of the present invention.

FIG. 1 is a plan view showing a layout of a semiconductor device including a nonvolatile memory device manufactured by a method according to an embodiment of the present invention. The semiconductor device includes a memory region 1000.

In the memory region 1000, MONOS type nonvolatile memory devices (hereinafter referred to as "memory cells") 100 are arranged in a plurality of columns and rows. In the memory region 1000, a first block B1 and part of each of other blocks B0 and B2 adjacent to the first block B1 are shown. Each of the blocks B0 and B2 has a configuration that is obtained by reversing the block B1.

Partially in a region between the block B1 and each of the adjacent blocks B0 and B2, an element isolation region 300 is formed. In each of the blocks, a plurality of word lines 50 (WL) extending in an X direction (row direction), and a plurality of bit lines 60 (BL) extending in a Y direction (column direction) are disposed. One word line 50 is connected to a plurality of word gates 14a arranged in an X direction. The bit lines 60 include impurity layers 16 and 18.

A conductive layer 40 that includes the first and second control gates 20 and 30 is formed so as to surround each of the impurity layers 16 and 18. That is, the first and second control gates 20 and 30 extend in a Y direction, and each pair of the first and second control gates 20 and 30 are connected to each other at one end with a conductive layer extending in an X direction. Furthermore, each pair of the first and second control gates 20 and 30 are connected at the another end to a common contact portion 200. Accordingly, the conductive layer 40 has a function of a control gate of a memory cell and a function as a wiring connecting the respective control gates arranged in a Y direction.

A single memory cell 100 includes one word gate 14a, first and second control gates 20 and 30, and impurity layers 16 and 18. The first and second control gates 20 and 30 are formed on both sides of the word gate 14a. The impurity layers 16 and 18 are formed outside of the control gates 20 and 30. Each of the impurity layers 16 and 18 is shared between adjacent memory cells 100.

The impurity layer 16 formed in the block B1 and the impurity layer 16 formed in the block B2 are adjacent to each other in a Y direction are electrically connected to each other through a contact impurity layer 400 formed within the semiconductor substrate. The contact impurity layer 400 is formed on a side opposite to the common contact portion 200 of the control gate with respect to the impurity layer 16.

On the contact impurity layer 400, a contact 350 is formed. The bit line 60 (again, including the impurity layer 16) is electrically connected to a wiring layer in an upper layer through the contact 350.

Similarly, the impurity layer 18 formed in the block B1 and the impurity layer 18 formed in the block B0 are adjacent to each other in a Y direction on a side where the common contact portion 200 is not disposed, and are electrically connected to each other through another contact impurity layer 400. As is apparent from FIG. 1, in one block, in a plan layout of a plurality of the common contact portions 200, the impurity layers 16 and the impurity layers 18 are formed alternately on different sides, resulting in a staggered lattice. Furthermore, with respect to one block, in a plan layout of a plurality of the contact impurity layers 400, the plurality of the contact impurity layers 400 is alternately formed on different sides for the impurity layers 16 and the impurity layers 18, resulting in a staggered lattice.

Figure 2:
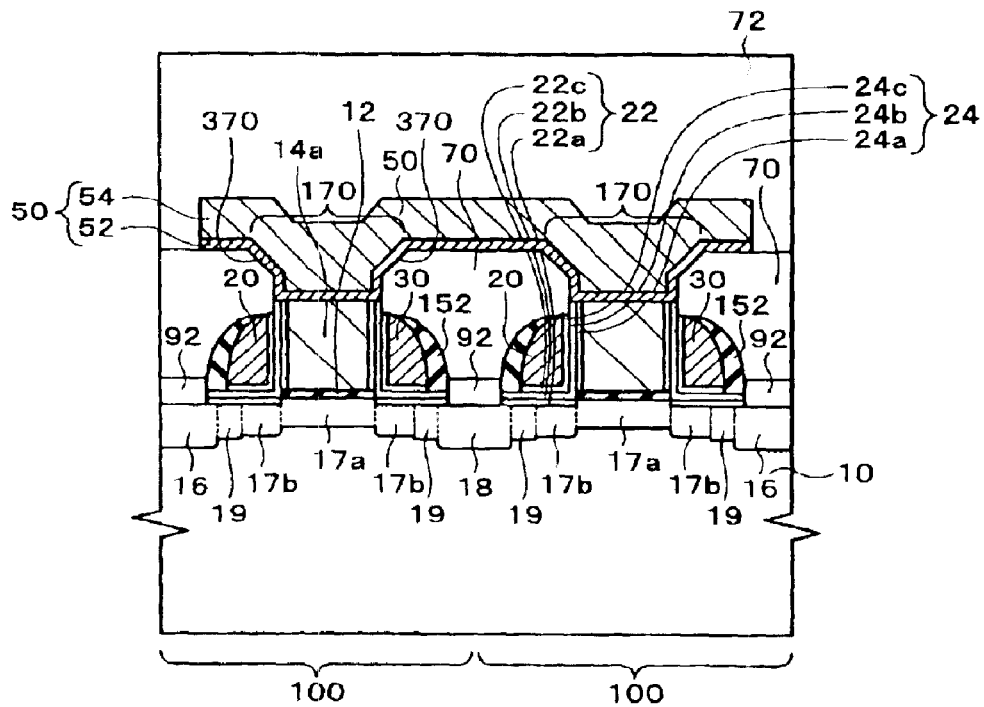
FIG. 2 is a cross sectional view schematically showing a portion along an A—A line of FIG. 1.

Next, with reference to FIG. 2, a cross sectional structure of a semiconductor device will be explained. FIG. 2 is a cross sectional view along an A—A line of FIG. 1.

In the memory region 1000, the memory cell 100 includes the word gate 14a, impurity layers 16 and 18, the first control gate 20 and the second control gate 30. The word gate 14a is formed above a semiconductor substrate 10 on the first gate insulating layer 12 interposed therebetween. The impurity layers 16 and 18 are formed inside of the semiconductor substrate 10. Each of the impurity layers 16 and 18 becomes a source region or a drain region. Furthermore, on each of the impurity layers 16 and 18, a silicide layer 92 is formed.

The first and second control gates 20 and 30, respectively, are formed along both sides of the word gate 14a. The first control gate 20 is formed above the semiconductor substrate 10 with a second gate insulating layer 22 interposed therebetween and opposite to one side surface of the word gate 14a through a side insulating layer 24 interposed therebetween. Similarly, the second control gate 30 is formed above the semiconductor substrate 10 with the second gate insulating layer 22 interposed therebetween and opposite to the other side surface of the word gate 14a through a side insulating layer 24 interposed therebetween. The cross sectional shape of each of the control gates is similar to a cross sectional structure of a sidewall insulating layer in an existing MOS transistor.

The second gate insulating layer 22 can be an ONO film. Specifically, the second gate insulating layer 22 is a laminate film of, e.g., a bottom silicon oxide layer (first silicon oxide layer) 22a, a silicon nitride layer 22b, and a top silicon oxide layer (second silicon oxide layer) 22c. The first silicon oxide layer 22a forms a potential barrier between a channel region and a charge storage region. The silicon nitride layer 22b functions as a charge storage region that traps a carrier (for instance, electrons). The second silicon oxide layer 22c forms a potential barrier between the control gate and the charge storage region.

The side insulating layer 24 can be an ONO film. Specifically, the side insulating layer 24 is a laminate film of, e.g., a first silicon oxide layer 24a, a silicon nitride layer 24b and a second silicon oxide layer 24c. The side insulating layer 24 electrically separates the word gate 14a from each of the control gates 20 and 30. Furthermore, in the side insulating layer 24, the top end of at least the first silicon oxide layer 24a, is disposed at a higher position than those of (that is extends upward beyond) top ends of the control gates 20 and 30 with respect to the semiconductor substrate 10 in order, e.g., to inhibit short circuits from occurring between the word gate 14a and each of the first and the second control gates 20 and 30.

The side insulating layer 24 and the second gate insulating layer 22 can be formed in the same deposition process. Accordingly, the layer structures thereof can be the same.

In adjacent memory cells 100, between the adjacent first control gate 20 and second control gate 30, a second insulating layer 70 is formed. The second insulating layer 70 covers the control gates 20 and 30 so as not to expose at least these. Furthermore, the top surface of the second insulating layer 70 is disposed at a higher position than (that is, extends upward beyond) the top surface of the word gate 14a with respect to the semiconductor substrate 10. By thus forming the second insulating layer 70, the first and second control gates 20 and 30 can be electrically separated more effectively from the word gate 14a and the word line 50.

On the word gate 14a, as shown in FIG. 2, the word line 50 is formed. The word line 50 is made of a laminate film of, for instance, a titanium layer 52 and a titanium nitride layer 54. When the word line 14 is made, e.g., of doped poly-silicon, the titanium layer 52 can, e.g., improve adhesion between the word line 14 and the titanium nitride layer 54.

Figure 14:
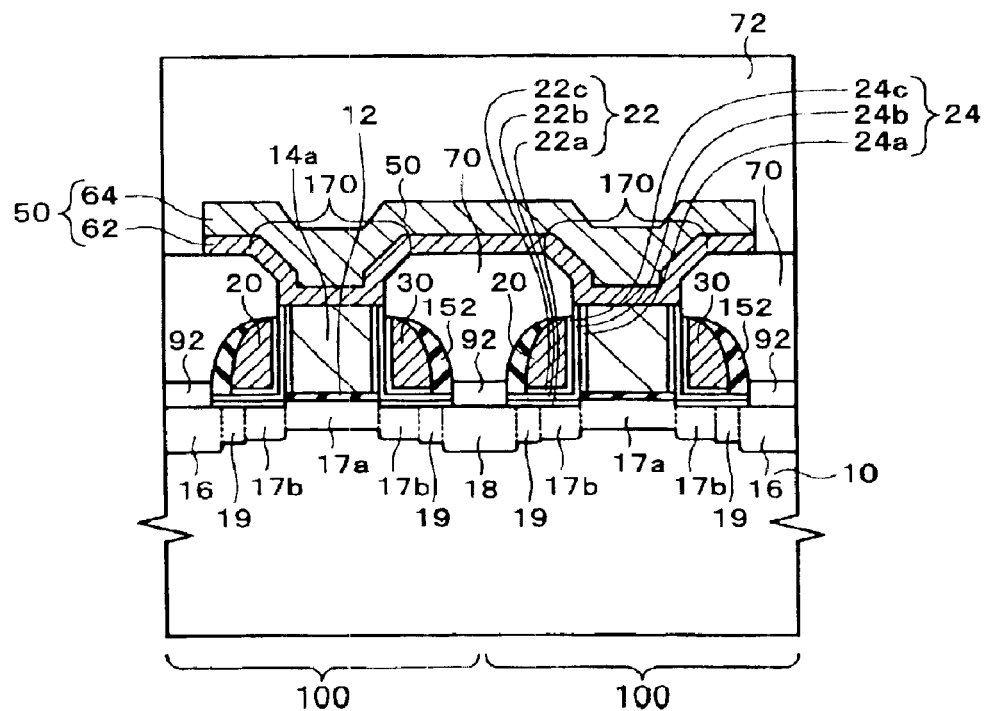
FIG. 14 is a diagram showing a process in one modified embodiment according to the present invention.
Figure 15:
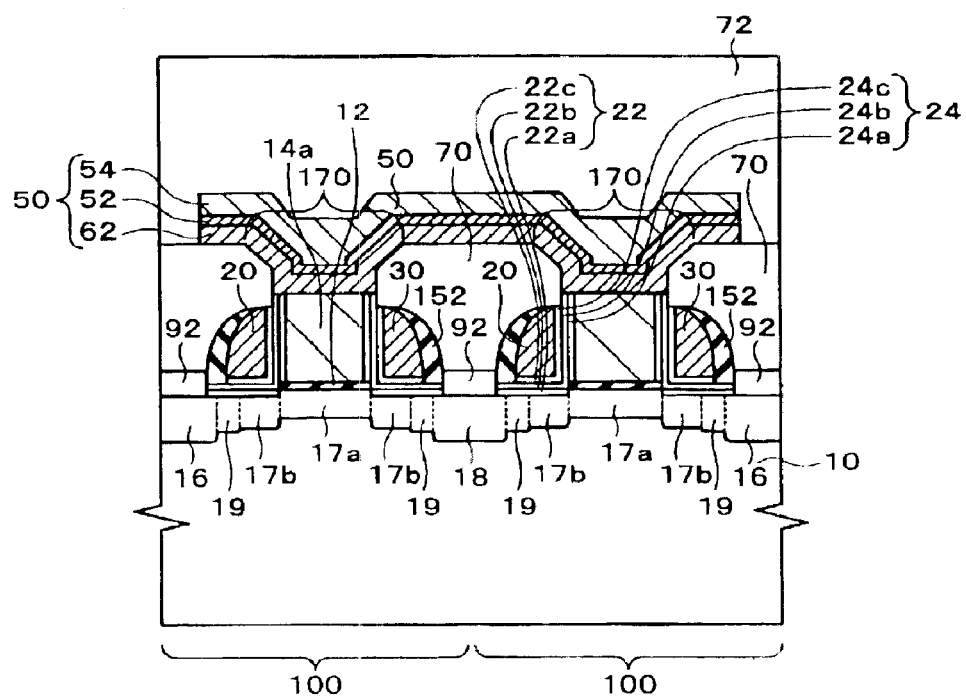
FIG. 15 is a diagram showing a process in modified embodiment according to the present invention.
Figure 16:
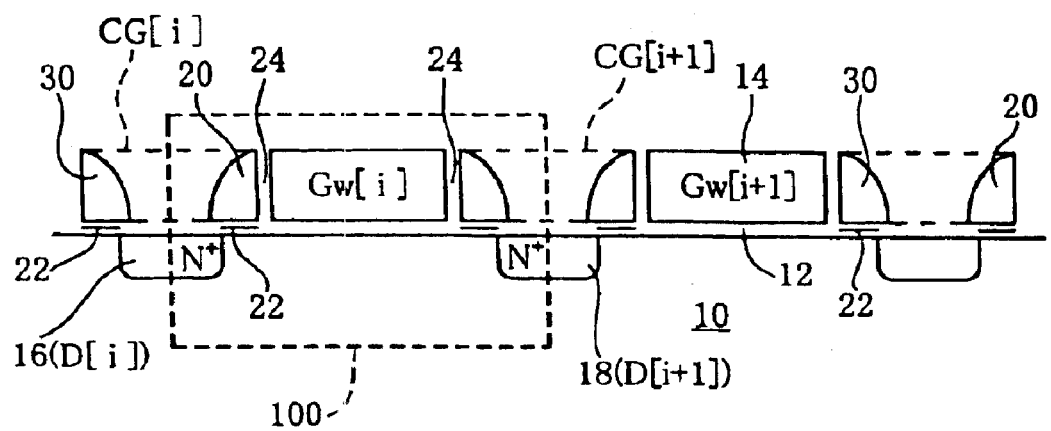
FIG. 16 is a cross sectional view showing a MONOS-type memory cell according to the Background Art.

Alternatively, the word line 50, as shown in FIG. 14, can be formed of a laminate film, e.g., of a polycrystalline silicon layer 62 and a layer of metal silicide 64 such as, for instance, WSi or MoSi. Alternatively, as shown in FIG. 15, the word line 50 may be formed, e.g., of a laminate film of a polycrystalline silicon layer 62, a titanium layer 52, and a titanium nitride layer 54. In this case, the titanium layer 52 can, e.g., improve adhesion between the polycrystalline silicon layer 62 and the titanium nitride layer 54.

Furthermore, in the second insulating layer 70, over the word gate 14a, an opening 170 is formed. The opening 170, as shown in FIG. 2, has an inverse tapered shape. Here, "the opening 170 has an inverse tapered shape" means that the opening 170, in an area of a cross section when the opening 170 is cut with a plane in parallel with a plane direction of the semiconductor substrate 10, becomes larger as the distance between a cut cross section and the semiconductor substrate 10 becomes larger. In addition, "the plane direction of the semiconductor substrate 10" means, in the semiconductor substrate 10, the surface whereon the memory cell 100 is formed. Specifically, as shown in FIG. 2, when an inclined plane 370 is formed on the second insulating layer 70, the opening 170 has an inverse tapered shape. Phrased alternatively, when taking horizontal cross-sections at successive points moving in a vertical direction away from the word gate 14a, the opening 170 becomes progressively wider.

On the semiconductor substrate 10 whereon the memory cells 100 and so on are formed, an interlayer insulating layer 72 is formed.

Nonvolatile Memory Device Manufacture

Next, with reference to FIGS. 3 through 13, a method of manufacturing a nonvolatile memory device according to an embodiment of the present invention will be explained. All the cross section views correspond to portions along an A—A line of FIG. 1. In FIGS. 3 through 13, portions substantially the same as the portions shown in FIGS. 1 and 2 are given the same reference numerals, and explanations thereof will be omitted.

Figure 3:
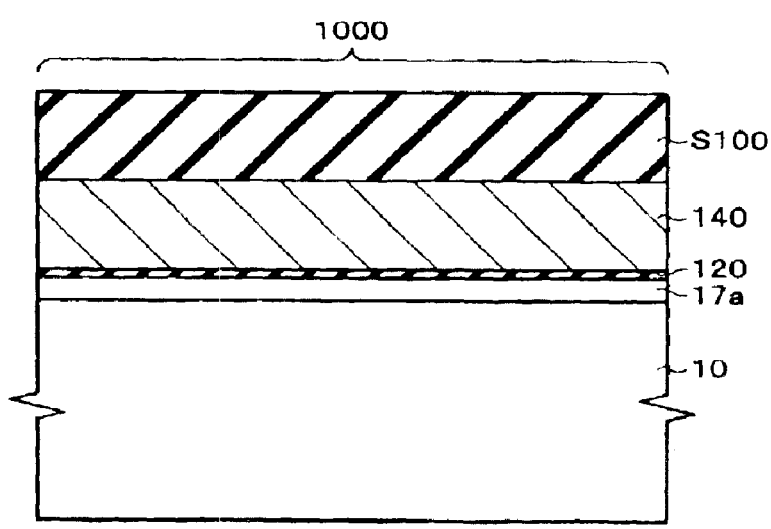
FIG. 3 is a diagram showing a process in one embodiment according to the present invention.

First, as shown in FIG. 3, on a surface of the semiconductor substrate 10, e.g., according to a trench isolation method, element isolation regions 300 (FIG. 1) are formed. Subsequently, as the channel dopant, an ionized, e.g., P type, impurity is implanted, and thereby an impurity layer 17a is formed inside of the semiconductor substrate 10. Next, by ion implanting, a contact, e.g., N type, impurity layer 400 (FIG. 1) is formed inside of the semiconductor substrate 10.

Subsequently, on a surface of the semiconductor substrate 10, an insulating layer (first insulating layer) 120 to be a gate insulating layer is formed. Furthermore, a gate layer (first conductive layer) 140 to be the word gate 14a is deposited on the insulating layer 120. The gate layer 140 is made of, e.g., doped polysilicon. Still furthermore, a stopper layer S100, e.g., for the later CMP process, is formed on the gate layer 140. The stopper layer S100 is made of, e.g., a silicon nitride layer.

Figure 4:
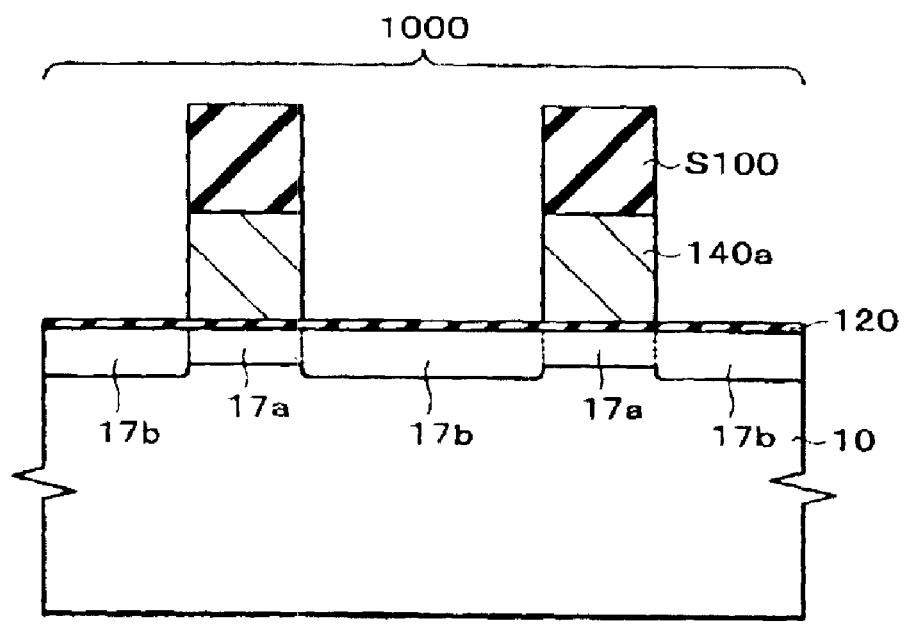
FIG. 4 is a diagram showing a process in one embodiment according to the present invention.

Next, a resist layer (not shown in the drawing) is formed. Subsequently, with the resist layer as a mask, the stopper layer S100 is patterned. Thereafter, with the patterned stopper layer as a mask, the gate layer 140 is etched. As shown in FIG. 4, the gate layer 140 is patterned into a gate layer 140a.

Figure 5:
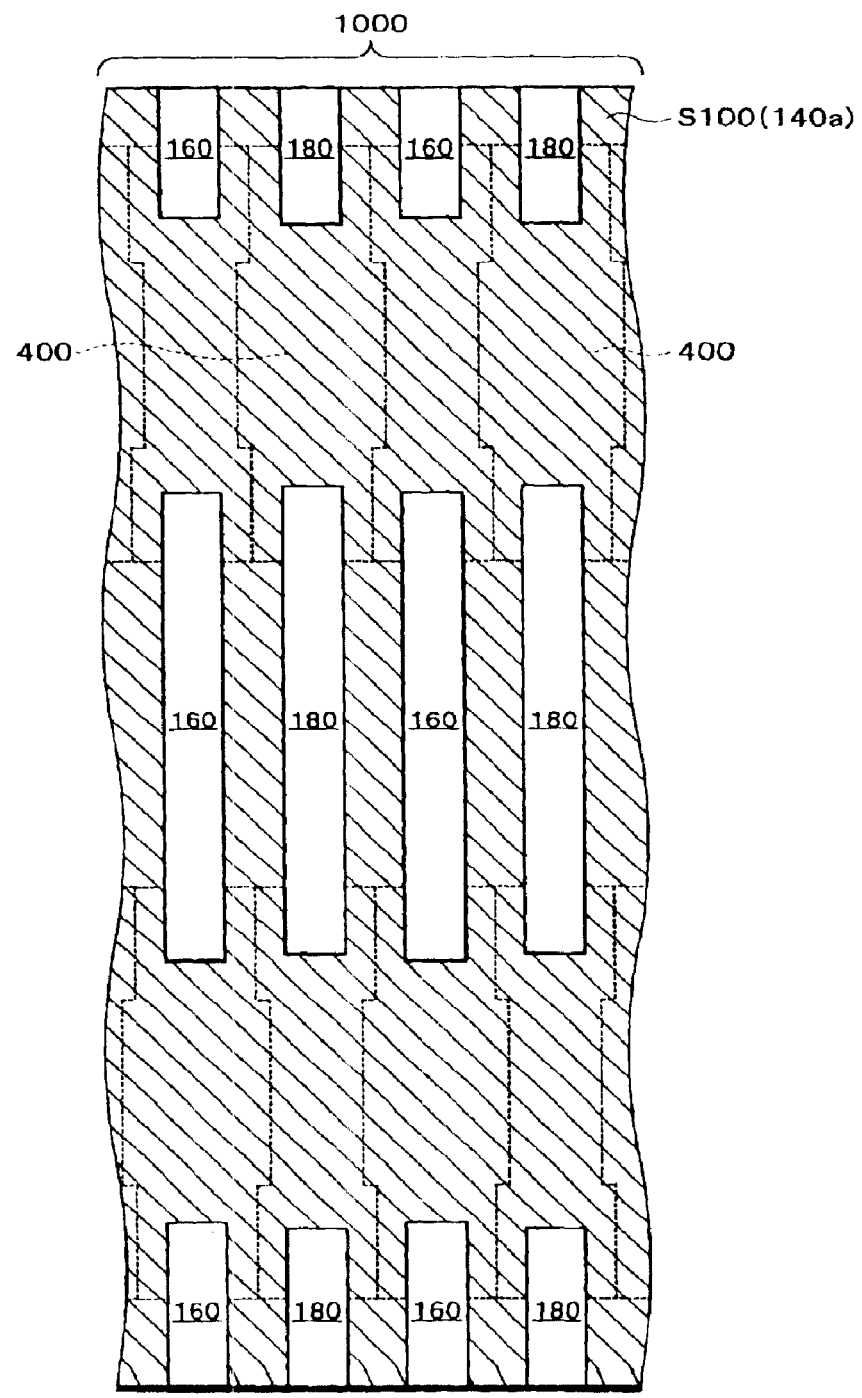
FIG. 5 is a diagram showing a process in one embodiment according to the present invention.

FIG. 5 shows in plan view the situation after the patterning. According to the patterning, a laminated body of the gate layer 140 and the stopper layer S100 within the memory region 1000 is provided with openings 160 and 180. The openings 160 and 180 substantially correspond to regions where the impurity regions 16 and 18 are later formed by use of ion implantation. In later processes, the side insulating layers and the control gates are formed along side surfaces of the openings 160 and 180.

Subsequently, as shown in FIG. 4, an ionized, e.g., P type, impurity (e.g., for stopping punch-through) is implanted, and thereby an impurity layer 17b is formed inside the semiconductor substrate 10.

Figure 6:
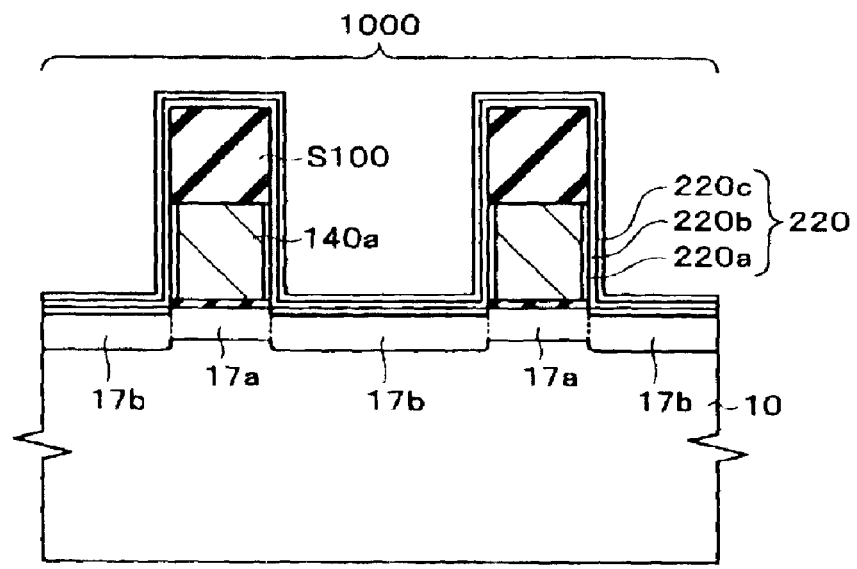
FIG. 6 is a diagram showing a process in one embodiment according to the present invention.

Thereafter, the surface of the semiconductor substrate is cleaned with, e.g., hydrofluoric acid. Thereby, an exposed insulating layer 120 is removed. In addition, as shown in FIG. 6, a first silicon oxide layer 220a is formed according to, e.g., a thermal oxidation method. A thermal oxidation film is formed on the exposed surface of the semiconductor substrate 10 and the gate layer 140a. The first silicon oxide layer 220a may be formed by use of, e.g., a CVD method.

Next, the first silicon oxide layer 220a is annealed. This annealing is applied in an atmosphere including, e.g., $NH_3$ gas. As a result of this pre-treatment, on the first silicon oxide layer 220a, a silicon nitride layer 220b tends to be uniformly deposited. Thereafter, the silicon nitride layer 220b can be deposited by use of, e.g., a CVD method.

Subsequently, the second silicon oxide layer 220c is formed by use of, e.g., a CVD method, specifically such as a high temperature oxidation method (HTO). The second silicon oxide layer 220c can be deposited also by use of, e.g., ISSG (In-Situ Steam Generation) treatment. A film deposited by use of the ISSG treatment is dense. When the ISSG treatment is applied, an anneal treatment for densifying the ONO film that will be described later can be omitted.

In the above process, when the silicon nitride layer 220b and the second silicon oxide layer 220c are deposited in the same furnace, the interface thereof can be prevented from being contaminated due to eliminating a need for intervening removal from the furnace. Since thereby a uniform ONO film can be formed, a memory cell 100 having stable electrical characteristics can be obtained. Furthermore, since a cleaning process for removing the contamination at the interface becomes unnecessary, the number of processes can be reduced.

After these individual layers are deposited, anneal treatment with, e.g., wet oxidation or LMP oxidation, is preferably applied to densify the individual layers.

In this embodiment, the ONO film 220, when patterned in a later process, becomes the second gate insulating layer 22 and the side insulating layer 24 (FIG. 2).

Figure 7:
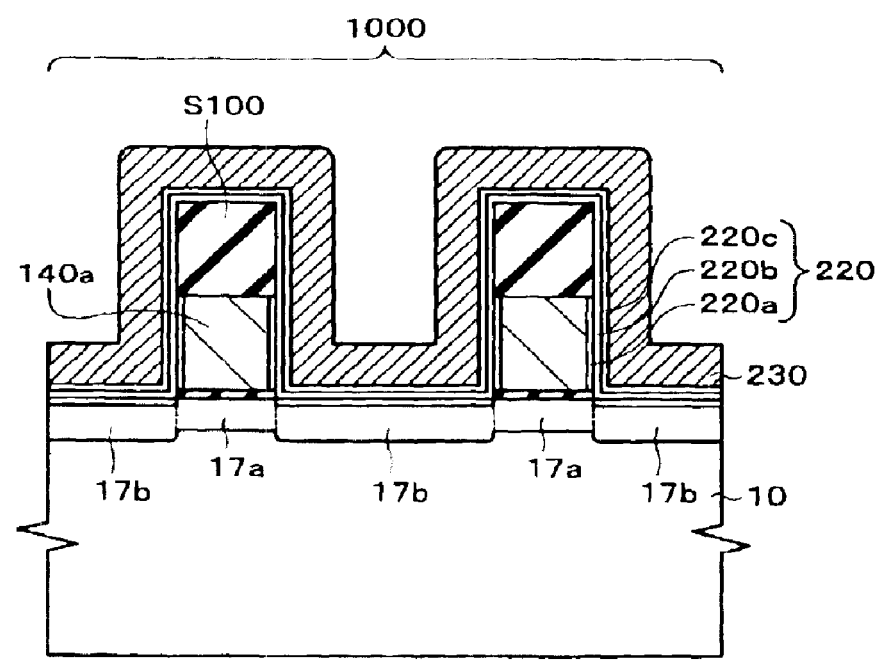
FIG. 7 is a diagram showing a process in one embodiment according to the present invention.

As shown in FIG. 7, a second conductive (e.g., doped polysilicon) layer 230 is formed on the second silicon oxide layer 220c. The doped polysilicon layer 230, etched later, becomes a conductive layer 40 from which are formed the control gates 20 and 30 (FIG. 1).

Figure 8:
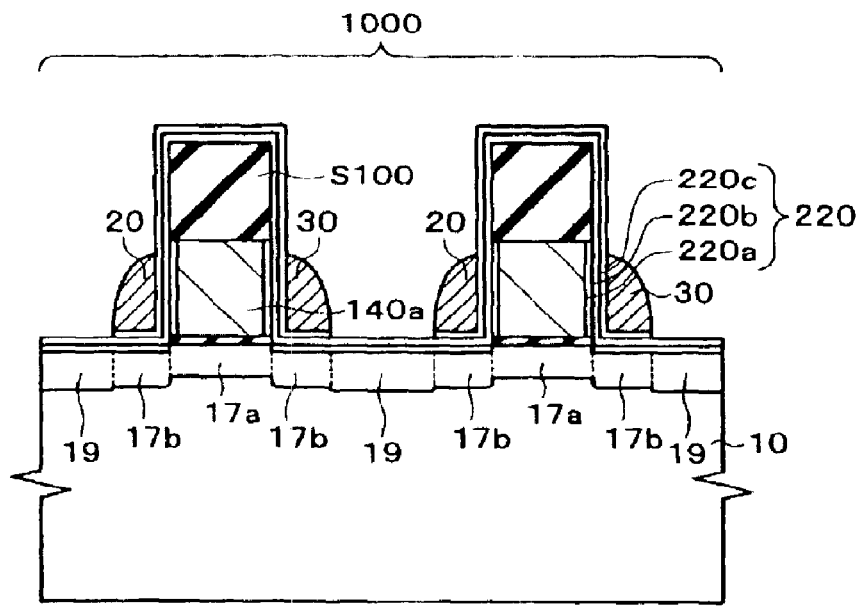
FIG. 8 is a diagram showing a process in one embodiment according to the present invention.

Subsequently, as shown in FIG. 8, the entirety of the doped polysilicon layer 230 is subjected to etching, e.g., anisotropic etching. Thereby, along side surfaces of the openings 160 and 180 in the memory region 1000 (FIG. 5), the first and second control gates 20 and 30 are formed. Here, as shown in FIG. 8, the control gates 20 and 30 to be formed are subjected to anisotropic etching until the top surfaces thereof become lower than the top surface of the gate layer 140a.

Next, as shown in FIG. 8, an impurity (e.g., N type) is ion-implanted, and thereby an impurity layer 19 is formed inside of the semiconductor substrate 10.

Figure 9:
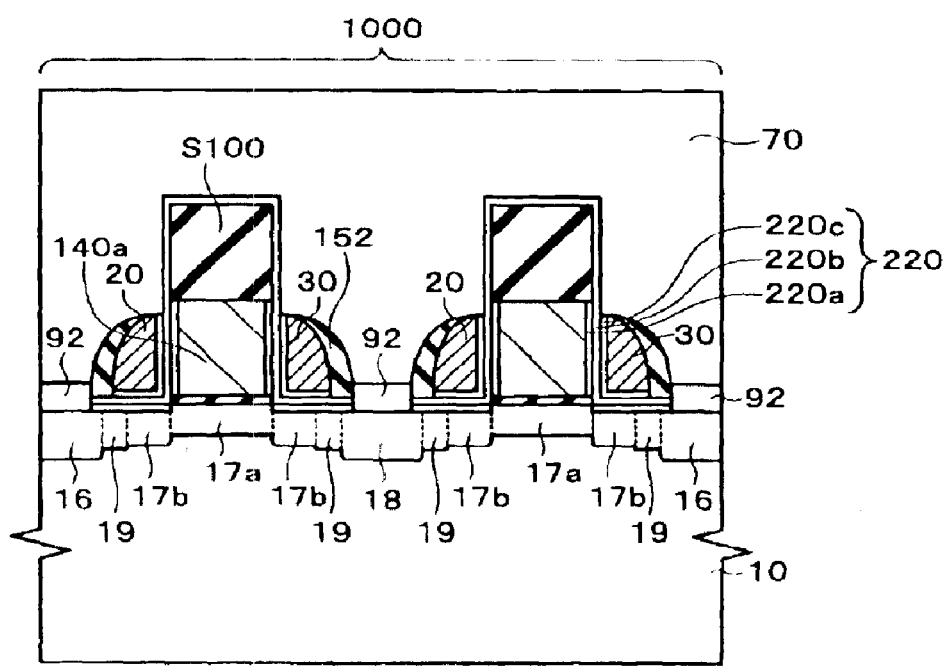
FIG. 9 is a diagram showing a process in one embodiment according to the present invention.

Furthermore, in the memory region 1000, a layer of an insulating material (not shown) such as silicon oxide or silicon nitride oxide is formed over the entire surface thereof. Subsequently, the insulating layer is subjected to etching, e.g., anisotropic etching, and thereby, as shown in FIG. 9, insulating layers 152 are allowed to remain on the control gates 20 and 30. Furthermore, by this etching, an insulating layer deposited in a region where a silicide layer is formed in later process is removed, and thereby the semiconductor substrate is exposed.

Then, as shown in FIG. 9, an impurity (e.g., N type) is ion-implanted, and thereby inside of the semiconductor substrate 10, the impurity layers 16 and 18 are formed.

Subsequently, a metal for use in silicide formation is deposited on the entire surface. The metal for use in silicide formation is, for instance, titanium or cobalt. Thereafter, the metal formed on the semiconductor substrate is subjected to a silicide reaction, and thereby a silicide layer 92 is formed on the exposed surface of the semiconductor substrate. Next, in the memory region 1000, the second insulating layer 70 such as silicon oxide or silicon nitride oxide is entirely formed. The second insulating layer 70 is formed so as to cover the stopper layer S100.

Figure 10:
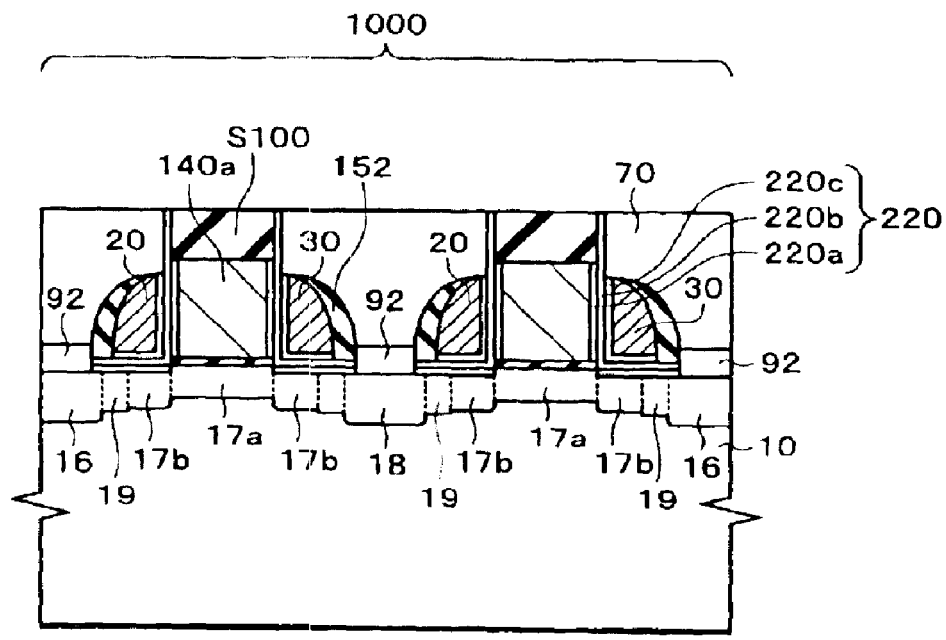
FIG. 10 is a diagram showing a process in one embodiment according to the present invention.

As shown in FIG. 10, the second insulating layer 70 is polished using, e.g., the CMP method until the stopper layer S100 is exposed, thereby the second insulating layer 70 is planarized. After the polishing, the second insulating layer 70 remains between the opposing control gates 20 and 30 though openings 170a have been formed in the second insulating layer 70.

Figure 11:
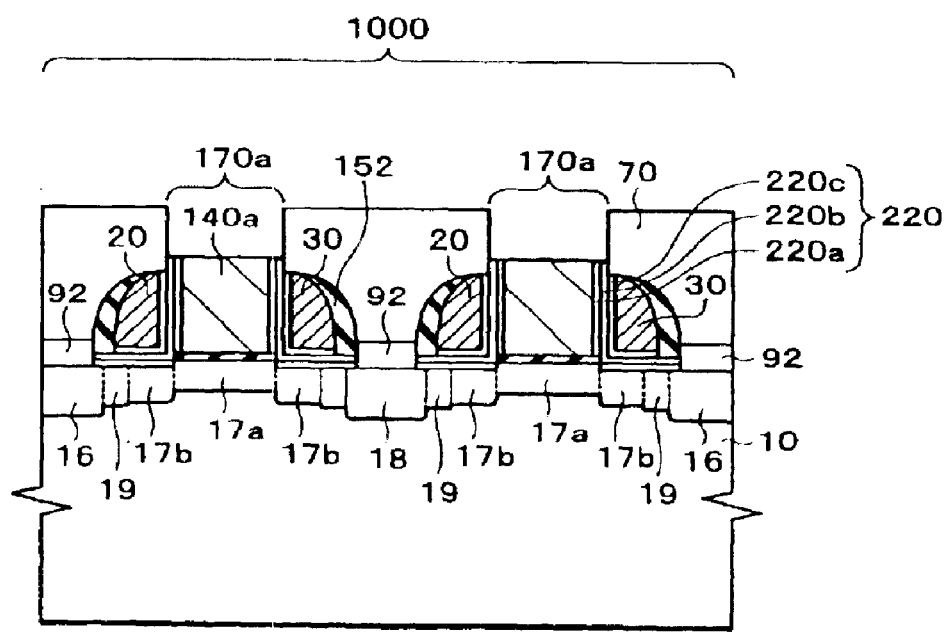
FIG. 11 is a diagram showing a process in one embodiment according to the present invention.

The stopper layer S100 is removed with, e.g., hot phosphoric acid. As a result, at least the top surface of the gate layer 140a is exposed, as shown in FIG. 11. That is, the opening 170a is: unplugged or re-opened by removing the stopper layer S100; and located above the gate layer 140a.

Figure 12:
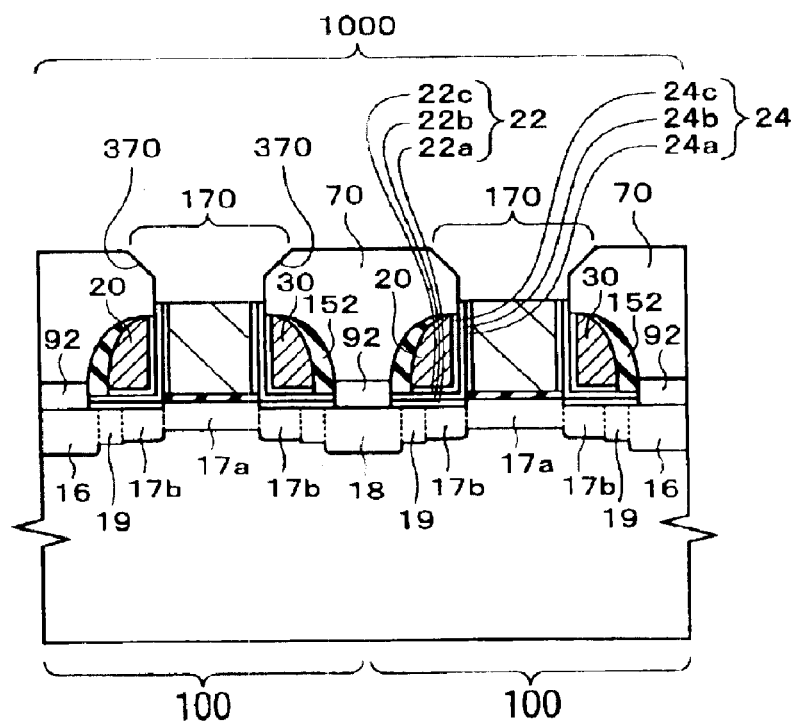
FIG. 12 is a diagram showing a process in one embodiment according to the present invention.

Subsequently, as shown in FIG. 12, a top portion of the opening 170a of the second insulating layer 70 is subjected to, e.g., reverse sputter, and thereby the shape of the opening 170 is modified. The opening 170 has, e.g., an inverse-tapered shape such as a linear taper. In the process, on an upper portion of the opening 170a of the second insulating layer 70, for instance an Ar gas is blown, and thereby a portion of the insulating layer where the gas is blown is removed. Due to this process, an inclined surface 370 is formed on the second insulating layer 70, and thereby the opening 170 having an inverse-tapered shape is formed.

Figure 13:
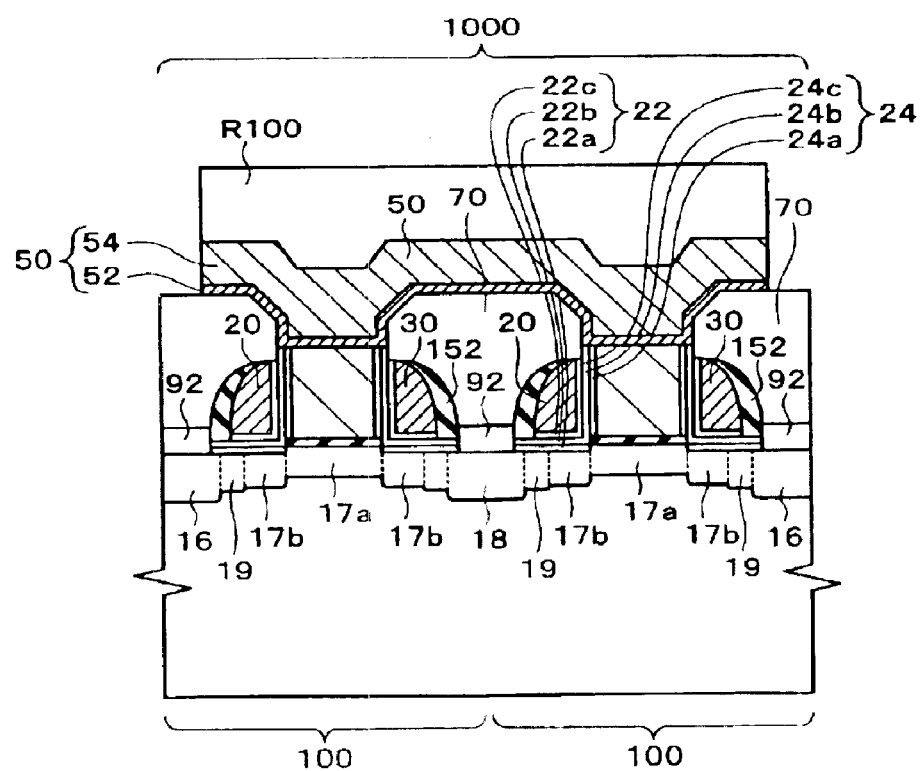
FIG. 13 is a diagram showing a process in one embodiment according to the present invention.

Next, for instance, a titanium layer and a titanium nitride layer are laminated, and thereby a third conductive layer (not depicted) is deposited over the entire surface. Subsequently, as shown in FIG. 13, a patterned resist layer R100 is formed on the doped polysilicon layer. With the resist layer R100 as a mask, the third conductive layer is patterned, and thereby, as shown in FIG. 13, the word line 50 made of a laminate film of the titanium layer 52 and the titanium nitride layer 54 is formed.

Subsequently, with the resist layer R100 as a mask, the gate layer 140a is etched. By the etching, a part of the gate layer 140a, where the word line 50 is not formed above, is removed. As a result, the word gate 14a arranged in array can be formed. The region wherefrom the gate layer 140a is removed corresponds to a region of an impurity, e.g., P type, layer that is formed later (impurity layer for use in element isolation) (FIG. 1).

In the etching process, the conductive layer 40 that includes the first and second control gate 20 and 30, being covered with the second insulating layer 70, is left without being etched.

Subsequently, an (e.g., impurity P type) is doped entirely over the semiconductor substrate 10. Thereby, in regions between individual word gates 14a in a Y direction, P type impurity layers (impurity layer for use in element isolation) 15 (FIG. 1) are formed. Owing to the P type impurity layers 15, the element isolation between individual nonvolatile semiconductor memory devices 100 can be more secured.

According to the above processes, the semiconductor device shown in FIGS. 1 and 2 can be manufactured.

Some advantages of such manufacturing methods include the following.

Firstly, where the word line 50 is formed of the laminate film of the titanium layer 52 and the titanium nitride layer 54, wiring resistance of the word line 50 can be made smaller.

Secondly, where the opening 170 having the inverse-tapered shape is formed, certain width of wiring of the word line 50 can be secured, resulting in preventing short circuits and an increase in resistance from occurring.

Alternative Embodiments

As an alternative embodiment of the present invention, the third conductive layer can be formed of the laminate film including, for instance, a polycrystalline silicon layer and a layer of metal silicide (such as, for instance, WSi or MoSi) that is subsequently patterned and thereby the word line 50 made of the laminate film of the polycrystalline silicon layer 62 and the metal silicide layer 64 can be formed (FIG. 14).

As another alternative embodiment of the present invention, the third conductive layer can be formed of the laminate film including, for instance, a polycrystalline silicon layer, a titanium layer, and a titanium nitride layer that are subsequently patterned, and thereby the word line 50 made of the laminate film of a polycrystalline silicon layer 62, titanium layer 52 and a titanium nitride layer 54 can be formed (FIG. 15).

In the above cases, the polycrystalline silicon layer 62 can be sufficiently embedded into the opening 170. Accordingly, the word line 50 can be easily planarized and accordingly load at the etching (namely, when the word line 50 is formed) can be reduced. Furthermore, also in these cases, the wiring resistance of the word line 50 can be made smaller.

While the present invention has been particularly shown and described with reference to embodiments thereof, other changes in form and details may be made therein without departing from the spirit and scope of the invention. For instance, a SOI substrate may be replaced as a semiconductor substrate instead of a bulk semiconductor substrate used in the above embodiment.

The entire disclosure of Japanese Patent Application No. 2002-055982 filed Mar. 1, 2002 is incorporated by reference herein.

What is claimed is:

1. A method for manufacturing a nonvolatile memory device, the method comprising:

forming a first insulating layer above a semiconductor layer;

forming a first conductive layer above the first insulating layer;

forming a stopper layer above the first conductive layer;

patterning the stopper layer and the first conductive layer;

forming an ONO film made of a first silicon oxide layer, a silicon nitride layer and a second silicon oxide layer above the semiconductor layer and on both side surfaces of the first conductive layer;

forming a second conductive layer above the ONO film;

applying anisotropic etching to the second conductive layer, and thereby forming a side wall control gate aside each of both side surfaces of the first conductive layer, the ONO film being interposed therebetween;

forming an impurity layer to be a source region or a drain region inside of the semiconductor layer;

forming a second insulating layer above an entire surface of the semiconductor layer;

polishing the second insulating layer so as to expose the stopper layer;

removing the stopper layer;

forming, on the entire surface, a third conductive layer made of a laminate film of a titanium layer and a titanium nitride layer;

patterning the third conductive layer and thereby forming a word line; and patterning the first conductive layer and thereby forming a word gate;

wherein an opening is formed in the second insulating layer by removing the stopper layer, an upper portion of the opening of the second insulating layer is subjected to reverse sputter, and thereby the opening is formed into an inverse-tapered shape.

* * * * *